United States Patent
Lee et al.

(10) Patent No.: US 7,400,001 B2
(45) Date of Patent: Jul. 15, 2008

(54) NITRIDE BASED HETERO-JUNCTION FIELD EFFECT TRANSISTOR

(75) Inventors: Jae Hoon Lee, Kyungki-do (KR); Jung Hee Lee, Kyungki-do (KR)

(73) Assignee: Samsung Electro-Mechanics Co., Ltd., Suwon, Kyungki-Do (KR)

(*) Notice: Subject to any disclaimer, the term of this patent is extended or adjusted under 35 U.S.C. 154(b) by 73 days.

(21) Appl. No.: 10/998,942

(22) Filed: Nov. 30, 2004

(65) Prior Publication Data

US 2006/0049426 A1    Mar. 9, 2006

(30) Foreign Application Priority Data

Sep. 8, 2004    (KR) ............ 10-2004-0071616

(51) Int. Cl.
    *H01L 29/778* (2006.01)
(52) U.S. Cl. ............ 257/194; 257/192; 257/E29.246; 257/E29.252; 257/E29.253
(58) Field of Classification Search ............ 257/194, 257/192, E29.245–E29.249, E29.253, E29.252
    See application file for complete search history.

(56) References Cited

U.S. PATENT DOCUMENTS

| | | | | |
|---|---|---|---|---|
| 5,843,590 A | * | 12/1998 | Miura et al. ............ | 428/698 |
| 5,929,467 A | * | 7/1999 | Kawai et al. ............ | 257/192 |
| 6,165,812 A | * | 12/2000 | Ishibashi et al. ............ | 438/46 |
| 6,261,931 B1 | * | 7/2001 | Keller et al. ............ | 438/492 |
| 6,486,502 B1 | * | 11/2002 | Sheppard et al. ............ | 257/194 |
| 6,586,781 B2 | * | 7/2003 | Wu et al. ............ | 257/194 |
| 6,630,692 B2 | * | 10/2003 | Goetz et al. ............ | 257/94 |
| 6,821,807 B2 | * | 11/2004 | Kano et al. ............ | 438/46 |
| 6,943,095 B2 | * | 9/2005 | Vaudo et al. ............ | 438/479 |
| 2002/0036287 A1 | * | 3/2002 | Yu et al. ............ | 257/20 |
| 2003/0178633 A1 | * | 9/2003 | Flynn et al. ............ | 257/101 |
| 2004/0195562 A1 | * | 10/2004 | Munns ............ | 257/1 |
| 2004/0238842 A1 | * | 12/2004 | Micovic et al. ............ | 257/192 |

* cited by examiner

*Primary Examiner*—Matthew C Landau
(74) *Attorney, Agent, or Firm*—Lowe Hauptman Ham & Berner

(57) ABSTRACT

A nitride based hetero-junction field effect transistor includes a high resistance nitride semiconductor layer formed on a substrate, an Al-doped GaN layer formed on the high resistance nitride semiconductor layer and having an Al content of 0.1~1%, an undoped GaN layer formed on the Al-doped GaN layer, and an AlGaN layer formed on the undoped GaN layer such that a two-dimensional electron gas (2DEG) layer is formed at an interface of the undoped GaN layer.

11 Claims, 3 Drawing Sheets

NITRIDE BASED HETERO-JUNCTION FIELD EFFECT TRANSISTOR

RELATED APPLICATIONS

The present application is based on, and claims priority from, Korean Application Number 2004-71616, filed Sep. 8, 2004, the disclosure of which is incorporated by reference herein in its entirety.

BACKGROUND OF THE INVENTION

1. Field of the Invention

The present invention relates to a hetero-junction field effect transistor, and more particularly, to a high-power nitride based hetero-junction field effect transistor having enhanced high frequency characteristics.

2. Description of the Related Art

Recently, a hetero-junction field effect transistor has been made of a nitride based-compound semiconductor to satisfy requirements for high frequency and high power electrical devices. Generally, since the nitride semiconductor has a wider band gap energy, a higher thermal/chemical stability, and a higher electron saturation velocity, compared with a typical semiconductor material, it has been widely applied not only to photo devices, but also to high frequency and high power electrical devices.

The nitride based hetero-junction field effect transistor has various advantages, such as a high breakdown electric field (about $\sim 3 \times 10^6$ V/cm), high electron saturation velocity (about $\sim 3 \times 10^7$ cm/sec), high thermal/chemical stability, and the like. Furthermore, due to wide band discontinuity at interfaces of the junction, a hetero-junction structure of AlGaN/GaN implemented in the nitride based hetero-junction field effect transistor can be provided with a high concentration electron, thereby enhancing electron mobility.

FIG. 1 is a view illustrating an example of a basic structure of a conventional nitride based hetero-junction field effect transistor.

Referring to FIG. 1, the conventional nitride based hetero-junction field effect transistor (HFET) 10 comprises a sapphire substrate 11 formed with a low temperature buffer layer 12. A semi-insulated or high resistance GaN layer 13 and an AlGaN layer 17 are formed on the buffer layer 12. The AlGaN layer 17 is provided at both ends of the top surface thereof with source and drain electrodes 19a and 19c, respectively, and with a gate electrode 19b between the source and the drain electrodes 19a and 19c.

In the HFET structure, a two-dimensional electron gas (2DEG) layer 18 is formed by virtue of a hetero-junction between the GaN layer 13 and the AlGaN layer 17 having different band gaps, respectively. Here, if a signal is input to the gate electrode 19b, a channel is formed in the 2DEG layer 18, allowing electric current to flow between the source and the drain electrodes 19a and 19c.

The GaN layer 13 is formed of an undoped GaN layer, and preferably has a relatively high resistance for preventing current leakage to the sapphire substrate 11 and for separation between elements.

However, in order to ensure a higher resistance, the GaN layer 13 comprises relatively more defects, resulting in reduction of crystallinity. As a result, there are problems of a high carrier concentration due to the defects without doping impurities, and of difficulty to provide high carrier mobility.

In order to solve the problems, a method of forming the semi-insulated GaN layer by way of two growth stages (growth at a low temperature and at a high temperature) has been recently suggested. However, even though the crystallinity of the GaN layer is enhanced by way of a secondary high temperature growth, it is difficult to substantially enhance the crystallinity, since the GaN layer grown by way of the secondary high temperature growth is based on the GaN layer grown by way of the primary low temperature growth.

As such, according to the conventional technology, due to the crystallinity of the channel layer unavoidably formed during a process for lowering the contact resistance of the GaN layer, there is a problem in that electric characteristics of DC and RF of the HFET device are deteriorated.

SUMMARY OF THE INVENTION

The present invention has been made in view of the above problems, and it is an object of the present invention to provide a nitride based hetero-junction field effect transistor, which is formed by way of repetitious growth of an Al-doped GaN layer and an undoped GaN layer at least one time, enhancing crystallinity, resulting in the provision of excellent electrical characteristics.

In accordance with an aspect of the present invention, the above and other objects can be accomplished by the provision of a hetero-junction field effect transistor, comprising: a high resistance nitride semiconductor layer formed on a substrate; an Al-doped GaN layer formed on the high resistance nitride semiconductor layer and having an Al content of 0.1~1 mol %; an undoped GaN layer formed on the Al-doped GaN layer; and an AlGaN layer formed on the undoped GaN layer such that a two-dimensional electron gas (2DEG) layer is formed at an interface between the AlGaN layer and the undoped GaN layer.

The Al-doped GaN layer may have the Al content in the range of 0.3~0.6 mol %, and have a thickness of 0.1~1 μm. The undoped GaN layer may have a thickness of 0.1~1 μm.

In order to further enhance crystallinity, the hetero-junction field effect transistor may further comprise at least one pair of Al-doped GaN layer and undoped GaN layer between the undoped GaN layer and the AlGaN layer.

As a means for solving the problem of reduction of crystallinity, the high resistance GaN layer may be employed together with the semi-insulated GaN layer grown by way of two growth stages.

BRIEF DESCRIPTION OF THE DRAWINGS

The above and other objects, features and other advantages of the present invention will be more clearly understood from the following detailed description taken in conjunction with the accompanying drawings, in which:

FIGS. 4a and 4b are graphical representations of test results, in which FIG. 4a shows the relationship between FWHM (Full Wave Half Maximum) of a rocking curve and structures according to the conventional semiconductor and to the present invention, and FIG. 4b shows the relationship between carrier mobility, carrier concentration, and the layer structures.

DESCRIPTION OF THE PREFERRED EMBODIMENTS

Preferred embodiments of the present invention will now be described in detail with reference to the accompanying drawings.

Figure 2:
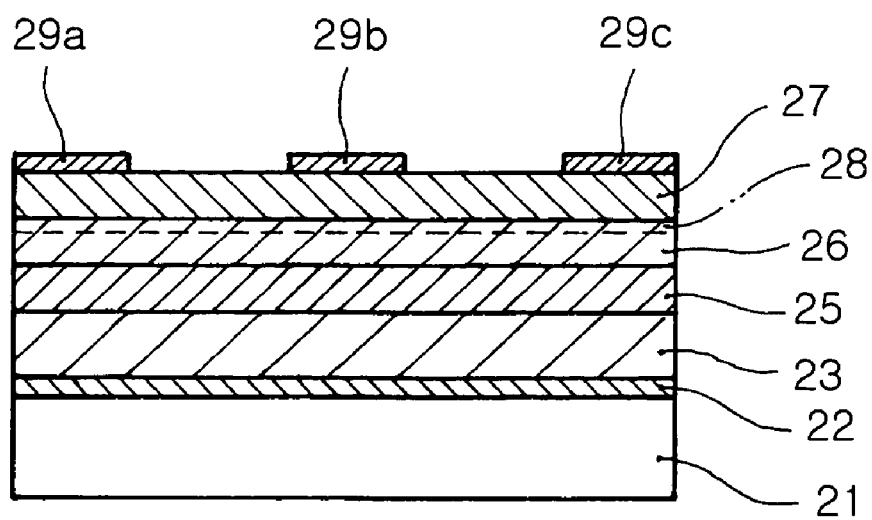
FIG. 2 is a view illustrating a nitride based hetero-junction field effect transistor according to one embodiment of the present invention.

FIG. 2 is a view illustrating a nitride based hetero-junction field effect transistor according to one embodiment of the present invention.

Referring to FIG. 2, a nitride based hetero-junction field effect transistor 20 according to the embodiment of the present invention comprises a substrate 21 formed with a buffer layer 22 thereon. Typically, the substrate 21 is made of sapphire, but the present invention is not limited thereto. Alternatively, the substrate may be a well-known substrate for growing a nitride, comprising a hetero-substrate, such as a SiC substrate, and a homo-substrate, such as a nitride substrate. The buffer layer 22 may be an AlN or GaN-based nitride layer grown at a lower temperature and available for a typical buffer layer.

A semi-insulated or high resistance GaN layer 23 is formed on the buffer layer 22. The high resistance GaN layer 23 may be a GaN layer grown by means of a high temperature growth continuously subsequent to a low temperature growth. For instance, in order to ensure high resistance, the GaN layer 23 may be a GaN layer grown in a two-stage process consisting of a primary growth at a temperature of 800~950° C. and a secondary growth at a temperature of 1,000~1,100° C., which is the temperature for single crystal growth.

Furthermore, according to the embodiment of the invention, an Al-doped GaN layer 25 and an undoped GaN layer 26 are sequentially formed on the high resistance GaN layer 23. Then, after forming an AlGaN layer 27 on the undoped GaN layer 26, source and drain electrodes 29a and 29c are provided at both ends of the top surface of the AlGaN layer 27, and a gate electrode 29b is formed thereon between the source and drain electrodes 29a and 29c. In such an HFET structure 20, a two-dimensional electron gas (2DEG) layer 28 is formed by way of a hetero junction between the undoped GaN layer 26 and the AlGaN layer 27 having different band gaps, respectively.

As a feature of the present invention, the Al-doped GaN layer 25 and the undoped GaN layer 26 serve to enhance not only crystallinity but also electrical characteristics of the HFET 20.

More specifically, the Al-doped GaN layer 25 provides an effect of passivation for Ga vacancies existing a defects in the GaN layer by virtue of Al doped in the GaN layer, and thereby restricts the growth of the Ga vacancies into two dimensional or three dimensional disclocations, resulting in excellent crystallinity. Accordingly, the Al-doped GaN layer 25 acts to negate the negative influence of low crystallinity from the high resistance GaN layer 23, and to provide a basis for growing an excellent crystal. Here, Al is doped in a GaN layer in a level not exceeding 1 mol %, and in order to ensure an effect of sufficiently enhanced crystallinity and prevent adverse effects caused by excessive doping, preferably, in the range of 0.1~1 mol %, more preferably in the range of 0.3~0.6 mol %, and, most preferably in the range of about 0.45 mol %.

Furthermore, the undoped GaN layer 26 may have more excellent crystallinity based on the crystallinity enhanced by virtue of the Al-doped GaN layer 25. Accordingly, the two-dimensional gas layer 28 formed on the interface of the undoped GaN layer 26 by means of the hetero-junction with the AlGaN layer 27 may have more enhanced mobility.

According to the present invention, the Al-doped GaN layer 25 and the undoped GaN layer 26 preferably have a thickness of 0.1~1 μm, respectively. If these layers have a thickness lower than 0.1 μm, these layers are not sufficiently grown, making it difficult to ensure enhanced crystallinity. A thickness more than 1 μm results in adverse effects, such as an increase of the size of the device, and additionally the enhanced crystallinity due to the Al-doped GaN layer 25 and the undoped GaN layer 26 is not further improved.

The reason of additionally forming the undoped GaN layer 26 to form the hetero-junction with the AlGaN layer 27 is not only to additionally enhance the crystallinity but also to solve the problem of mobility reduction, which can occur in operation at a high temperature. That is, when the two-dimensional gas layer is formed through the hetero-junction between the Al-doped GaN layer 25 and the AlGaN layer 27, Al doped in the GaN layer may act as a scattering center at a high temperature even when used in a small amount, thereby substantially reducing the mobility of the carriers. However, the problem of the mobility reduction due to the Al doped in the GaN layer can be solved by the undoped GaN layer 26.

As such, according to the present invention, the problem of the reduction of crystallinity caused by the high resistance GaN layer 23 can be solved by means of the Al-doped GaN layer 25 and the undoped GaN layer 26, and the electrical characteristics of the HFET device 20 can be remarkably improved by increasing the mobility.

In order to greatly improve the effect of enhancing crystallinity according to the present invention, another embodiment, in which at least one pair of Al-doped GaN layer and undoped GaN layer may be additionally formed between the Al-doped GaN layer and the high resistance GaN layer, may be provided. This embodiment of the present invention will be described with reference to FIG. 3.

Figure 3:
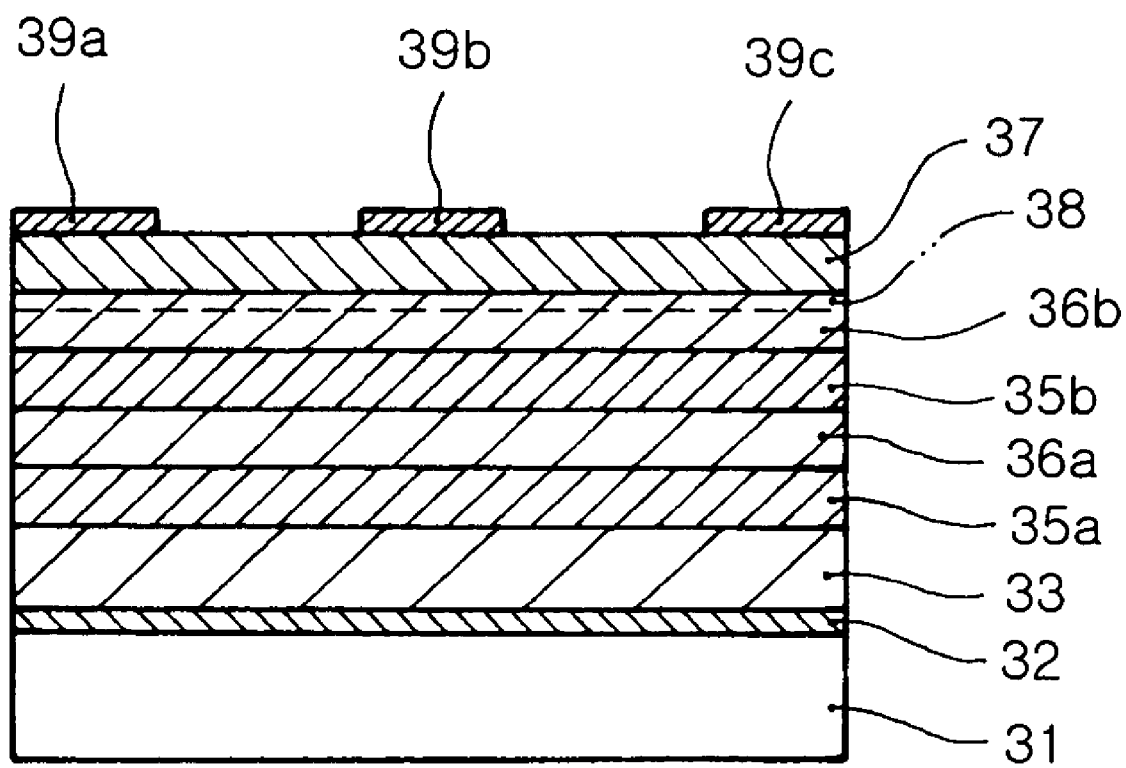
FIG. 3 is a view illustrating a nitride based hetero-junction field effect transistor according to another embodiment of the present invention.

FIG. 3 is a view illustrating a nitride based hetero-junction field effect transistor according to another embodiment of the present invention.

Referring to FIG. 3, a nitride based hetero-junction field effect transistor 30 according to another embodiment comprises a sapphire substrate 31 formed with a buffer layer 32 thereon. A semi-insulated or high resistant GaN layer 33 is formed on the buffer layer 32 for electrical separation between the element and the substrate. Two Al-doped GaN layers 35a and 35b and two undoped GaN layers 36a and 36b according to the present invention are alternately formed on the high resistance GaN layer 33. Then, AlGaN layer 37 is formed on the final undoped GaN layer 36b in order to form a two-dimensional electron gas layer 38. After forming the AlGaN layer 37 on the undoped GaN layer 36b, source and drain electrodes 39a and 39c are provided at both ends of the top surface of the AlGaN layer 37, and a gate electrode 39b is formed on the top surface of the AlGaN layer 37 between the source and drain electrodes 39a and 39c.

The substrate 31 may be a well-known hetero-substrate, such as a SiC substrate or a sapphire substrate, or a homo-substrate made of a nitride. The buffer layer 32 may be an AlN or GaN-based nitride layer grown at a lower temperature, and the high resistance GaN layer 33 may be a high resistance GaN layer grown through the two-stage process as described above. The high resistance GaN layer 33 grown by way of the two-stage process comprises a lower layer (a layer grown at a low temperature) having a relatively large amount of crystal defects), and an upper layer (a layer grown at a high temperature) having a relatively small amount of crystal defects).

The embodiment of the present invention has a structure wherein two Al-doped GaN layers 35a and 35b and two undoped GaN layers 36a and 36b are alternately formed on the high resistance GaN layer 33. In the embodiment shown in FIG. 3, similar to the Al-doped GaN layer 35a and the undoped GaN layer 36a acting to negate the negative influence of the low crystallinity from the high resistance GaN layer 33 and to ensure the excellent crystallinity, the Al-doped GaN layer 35b and the undoped GaN layer 36b can further enhance the crystallinity beyond the enhancement provided by the Al-doped GaN layer 35a and the undoped GaN layer 36a, thereby ensuring excellent crystal growth.

As a result, the undoped GaN layer 36b, which finally forms the hetero-junction with the AlGaN layer 37, provides more excellent crystallinity, and due to the excellent crystallinity, the concentration of the carriers caused by the defects can be reduced in the two-dimensional electron gas layer 38 formed on the interface between the undoped GaN layer 36b and the AlGaN layer 37, thereby ensuring enhanced carrier mobility.

According to the embodiment of the invention, the undoped GaN layer 36b forms the hetero-junction with the AlGaN layer, thereby solving the problem of mobility reduction, which can occur in operation at a high temperature.

EXAMPLE

This example is provided to verify enhancement of crystallinity of an undoped GaN layer, which forms a hetero-junction with an AlGaN layer in a hetero-junction field effect transistor according to the present invention, reduction of carrier concentration (the concentration of the carriers generated not by impurity doping but by defects), and an increase of the mobility due to the enhanced crystallinity.

First, in the case of Sample A, after growing a GaN layer at a low temperature as a buffer layer on a sapphire substrate, a high resistance GaN layer having a thickness of about 2 μm is grown under the condition wherein the high resistance GaN layer is primarily grown at a temperature of about 900° C. for about 1 minute, and secondarily grown at a temperature of about 1,050° C. for about 40 minutes after being grown for two minutes at a temperature increasing from 900° C. to 1,050° C. With the same method, other Samples B, C, and D are prepared for the test.

In the case of Sample B, an Al-doped GaN layer having a thickness of about 2 μm is formed, and in the case of Sample C, an Al-doped GaN layer and an undoped GaN layer, each having a thickness of about 1 μm, are formed. Additionally, in the case of Sample D, according to another embodiment of the present invention, two Al-doped GaN layers and two undoped GaN layers, each having a thickness of about 0.5 μm, are alternately formed.

Figure 1:
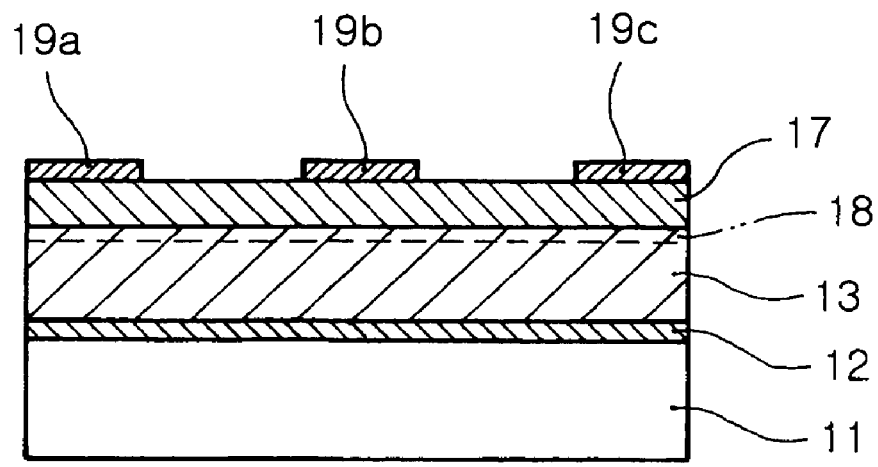
FIG. 1 is a view illustrating a conventional hetero-junction field effect transistor.

As such, it can be appreciated that the uppermost layers of the respective samples have the 2DEG layer finally formed on an interface by virtue of the hetero-junction with the AlGaN layer. For instance, it can be appreciated that Sample A has the same structure as the conventional structure (see FIG. 1), and that Samples C and D have the same structures as those of the embodiments of the present invention (see FIGS. 2 and 3), respectively. That is, since the uppermost layers of the respective samples are formed with the 2DEG layer, the crystallinity and the mobility depending on the crystallinity play an important role in determining the electrical characteristics of the completed HFET structure.

Figure 4A:
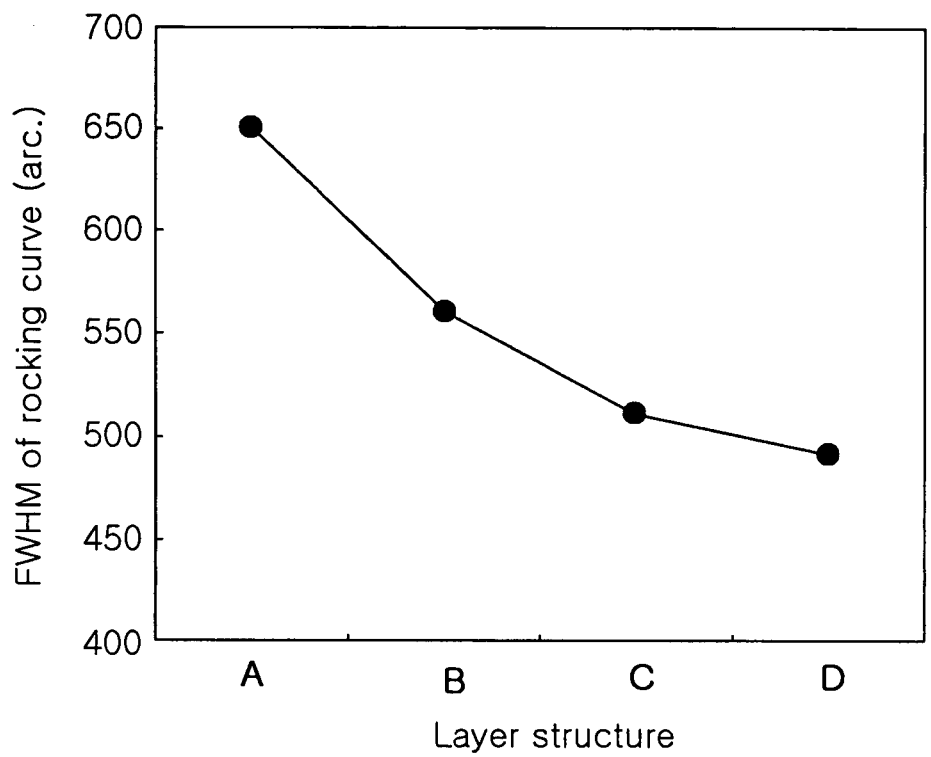
Figure 4B:
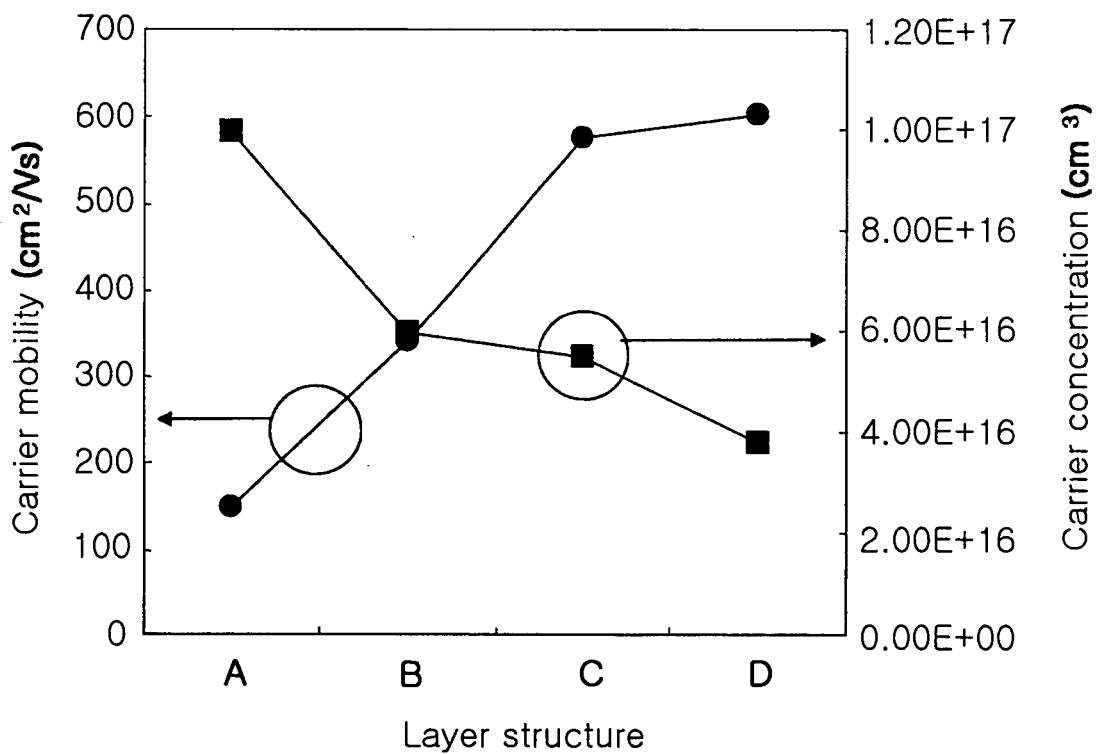

The crystallinity, the carrier mobility, and the carrier concentration were measured for the uppermost layers of the respective samples. Test results are shown in FIGS. 4a and 4b. FIG. 4a shows the FWHM of a rocking curve for the respective samples, and FIG. 4b shows the carrier mobility and the carrier concentration for the respective samples.

First, referring to FIG. 4a, it can be appreciated that, compared with Sample A having the conventional structure and having significantly lower crystallinity, Sample B with only the Al-doped GaN layer formed therein has relatively high crystallinity, and Samples C and D according to the present invention have further enhanced crystallinity. Particularly, in view of the fact that Sample D, in which two Al-doped GaN layers and two undoped GaN layers are alternately formed therein, has the most enhanced crystallinity, it can be seen that the crystallinity can be further enhanced by increasing the number of layers.

Furthermore, as shown in FIG. 4b, in view of the carrier mobility and the carrier concentration, Sample A having the conventional structure shows significantly lower carrier mobility and a significantly higher carrier concentration. However, Sample B has increased carrier mobility, and Samples C and D have further enhanced carrier mobility, respectively. Particularly, in the case of Sample D, it can be verified that the carrier mobility is increased to approximately 600 $cm^2/Vs$, and that the carrier concentration is decreased to $10^{15}/cm^2$. Decrease of the carrier mobility in the undoped crystal means that the defects acting as the carriers are decreased, thereby enhancing crystallinity.

Meanwhile, Sample B having only the Al-doped GaN layer formed therein has remarkably enhanced carrier mobility and carrier concentration, compared with Sample A having the conventional structure. However, compared with Samples C and D according to the present invention, in the case where the structure of Sample B is applied to the HFET, Al doped in the GaN layer may act as the scattering center at a high temperature, thereby impeding the function as a channel layer, as described above. Thus, as with Samples C and D according to the present invention, it is necessary to form the undoped GaN layer on the Al-doped GaN layer as a layer for forming the hetero-junction with the AlGaN layer.

As is apparent from the description, according to the present invention, the nitride based hetero-junction field effect transistor is formed with the Al-doped GaN layer and the undoped GaN layer grown on the high resistance GaN layer having the low crystallinity, thereby enhancing the crystallinity and remarkably improving the electrical characteristics of DC and RF of the HFET device.

Although the preferred embodiment of the present invention have been disclosed for illustrative purpose, those skilled in the art will appreciate that various modifications, additions and substitutions are possible without departing from the scope and spirit of the invention as disclosed in the accompanying claims.

What is claimed is:

1. A hetero-junction field effect transistor, comprising:
a high resistance nitride semiconductor layer formed on a substrate;
an Al-doped GaN layer formed on the high resistance nitride semiconductor layer and having an Al content of 0.3~0.6 mol %;
an undoped GaN layer formed on the Al-doped GaN layer; and
an AlGaN layer formed on the undoped GaN layer such that a two-dimensional electron gas (2DEG) layer is formed at an interface between the AlGaN layer and the undoped GaN layer;
wherein
the undoped GaN layer has a thickness of 0.1~1 μm; and
the Al-doped GaN layer has a thickness of 0.1~1 μm;
said hetero-junction field effect transistor further comprising at least one pair of another Al-doped GaN layer and another undoped GaN layer sequentially formed between the Al-doped GaN layer and the high resistance nitride semiconductor layer.

2. The hetero-junction field effect transistor as set forth in claim 1, wherein the high resistance nitride semiconductor layer is a semi-insulated GaN layer comprising a lower GaN layer having a first amount of crystal defects and an upper GaN layer having a second amount of crystal defects smaller than the first amount.

3. The hetero-junction field effect transistor as set forth in claim 1, wherein the Al doped in the Al-doped GaN layer is configured for passivation of Ga vacancies existing as defects in the undoped GaN layer, thereby restricting a growth of the Ga vacancies into two dimensional or three dimensional dislocations and enhancing crystallinity of the undoped GaN layer.

4. A hetero-junction field effect transistor, comprising:
a substrate;
a buffer layer formed on top the substrate;
a high resistance nitride semiconductor layer formed on top the buffer layer;
an Al-doped GaN layer formed on top the high resistance nitride semiconductor layer and having an Al content of 0.3~0.6 mol %;
an undoped GaN layer formed on top the Al-doped GaN layer; and
an AlGaN layer formed on top the undoped GaN layer such that a two-dimensional electron gas (2DEG) layer is formed at an interface between the AlGaN layer and the undoped GaN layer;
wherein
the high resistance nitride semiconductor layer is a semi-insulated GaN layer comprising a lower GaN layer having a first amount of crystal defects and an upper GaN layer having a second amount of crystal defects smaller than the first amount; and
the Al-doped GaN layer has a thickness of 0.1~1 μm.

5. The hetero-junction field effect transistor as set forth in claim 4, wherein the undoped GaN layer has a thickness of 0.1~1 μm.

6. The hetero-junction field effect transistor as set forth in claim 4, further comprising at least one pair of another Al-doped GaN layer and another undoped GaN layer sequentially formed between the Al-doped GaN layer and the high resistance nitride semiconductor layer.

7. The hetero-junction field effect transistor as set forth in claim 4, wherein the Al doped in the Al-doped GaN layer is configured for passivation of Ga vacancies existing as defects in the undoped GaN layer, thereby restricting a growth of the Ga vacancies into two dimensional or three dimensional dislocations and enhancing crystallinity of the undoped GaN layer.

8. A hetero-junction field effect transistor, comprising:
a substrate;
a buffer layer formed on top the substrate;
a high resistance nitride semiconductor layer formed on top the buffer layer;
an Al-doped GaN layer formed on top the high resistance nitride semiconductor layer and having an Al content of 0.3~0.6 mol %, the Al content being substantially uniform across the entire Al-doped GaN layer;
an undoped GaN layer formed on top the Al-doped GaN layer; and
an AlGaN layer formed on top the undoped GaN layer such that a two-dimensional electron gas (2DEG) layer is formed at an interface between the AlGaN layer and the undoped GaN layer;
wherein the Al-doped GaN layer has a thickness greater than 0.1 μm and lower than or equal to 1 μm;
said hetero-junction field effect transistor further comprising at least one pair of another Al-doped GaN layer and another undoped GaN layer sequentially formed between the Al-doped GaN layer and the high resistance nitride semiconductor layer.

9. The hetero-junction field effect transistor as set forth in claim 8, wherein the undoped GaN layer has a thickness of 0.1~1 μm.

10. The hetero-junction field effect transistor as set forth in claim 8, wherein the high resistance nitride semiconductor layer is a semi-insulated GaN layer comprising a lower GaN layer having a first amount of crystal defects and an upper GaN layer having a second amount of crystal defects smaller than the first amount.

11. The hetero-junction field effect transistor as set forth in claim 8, wherein the Al doped in the Al-doped GaN layer is configured for passivation of Ga vacancies existing as defects in the undoped GaN layer, thereby restricting a growth of the Ga vacancies into two dimensional or three dimensional dislocations and enhancing crystallinity of the undoped GaN layer.

* * * * *